United States Patent [19]
Bird et al.

[11] Patent Number: 5,946,552
[45] Date of Patent: Aug. 31, 1999

[54] UNIVERSAL COST REDUCED SUBSTRATE STRUCTURE METHOD AND APPARATUS

[75] Inventors: Kenneth Alfred Bird, New Paltz; Myra Muth Boenke, Hopewell Junction; Jason Lee Frankel, Beacon; Sarah Huffsmith Knickerbocker, Hopewell Junction; Ahmed Sayeed Shah, Wappingers Falls, all of N.Y.

[73] Assignee: International Business Machines Corporation, Armonk, N.Y.

[21] Appl. No.: 08/700,210

[22] Filed: Aug. 20, 1996

[51] Int. Cl.$^6$ .............................. H01L 21/44; H01L 23/34
[52] U.S. Cl. ...................... 438/107; 438/108; 438/111; 257/685; 257/700; 257/723
[58] Field of Search .................................. 438/107, 108, 438/109, 111, 112; 257/685, 686, 700, 723, 724

[56] References Cited

U.S. PATENT DOCUMENTS

| | | | |
|---|---|---|---|
| 4,195,195 | 3/1980 | de Miranda et al. | 174/68.5 |
| 4,458,297 | 7/1984 | Stopper et al. | 361/403 |
| 4,667,404 | 5/1987 | Reisman et al. | 29/847 |
| 4,717,988 | 1/1988 | Landis | 361/403 |
| 4,764,644 | 8/1988 | Reisman et al. | 174/68.5 |
| 4,870,356 | 9/1989 | Tingley | 324/158 F |
| 4,888,665 | 12/1989 | Smith | 361/400 |
| 5,006,673 | 4/1991 | Freyman et al. | 174/255 |
| 5,036,163 | 7/1991 | Spielberger et al. | 174/52.4 |
| 5,074,037 | 12/1991 | Sutcliffe et al. | 29/847 |
| 5,096,852 | 3/1992 | Hobson | 438/107 |
| 5,220,490 | 6/1993 | Weigler et al. | 361/409 |
| 5,227,338 | 7/1993 | Kryzaniwsky | 438/107 |
| 5,258,891 | 11/1993 | Sako | 361/742 |
| 5,360,992 | 11/1994 | Lowrey et al. | 257/666 |
| 5,715,147 | 2/1998 | Nagano | 257/672 |

*Primary Examiner*—Kevin M. Picardat
*Attorney, Agent, or Firm*—Steven J. Soucar

[57] ABSTRACT

A universal substrate includes an input/output (I/O) layer having a fixed I/O assignment of I/O locations for connection with a printed circuit board or the like. A chip receiving layer is provided for receiving one of at least two different but allied semiconductor chips, wherein each of the at least two different but allied chips include a set of bond pads and have a unique wire-out requirement. A first layer includes a plurality of bond pads and vias, the plurality of bond pads including at least two sets of bond pads, wherein each set is adapted for bond connection with a respective one of the at least two different semiconductor chips when received by said receiving means and further in accordance with a respective wire-out requirement. A second layer, different from the first layer, includes redistribution lines for coupling the plurality of bond pads and vias of the first layer to the I/O locations of the I/O layer in accordance with the wire-out requirements of the at least two different semiconductor chips and the fixed I/O assignment.

20 Claims, 12 Drawing Sheets

UNIVERSAL COST REDUCED SUBSTRATE STRUCTURE METHOD AND APPARATUS

BACKGROUND OF THE INVENTION

1. Field of the Invention

This invention relates generally to a method and apparatus for connecting a semiconductor chip to external electrical conductor leads and, more particularly, to a universal substrate having a fixed input/output assignment and adapted to receive at least two different but allied semiconductor chips having unique wire-out requirements.

2. Discussion of the Related Art

Semiconductor devices typically comprise one or more semiconductor chips designed for performing a desired function. The manufacture of semiconductor devices begins with the manufacture of the semiconductor chips. Semiconductor chips are first produced in a wafer form. The semiconductor chips are subsequently diced from the wafer into individual chips and then packaged. Individual chips, or multiple chips, may be packaged on a suitable substrate such as a multilayer ceramic (MLC) substrate or package, for instance.

Multilayer ceramic substrates are known in the art and thus only briefly described herein. In addition, a substrate may also be referred to as a package, wherein the terms are used interchangeably herein below. MLC substrates typically comprise a number of layers of ceramic material, including metallizations, internal wiring networks, vias, and bond pads. Each layer is first formed of an unfired ceramic material, then punched and patterned according to a desired semiconductor chip package design. The layers are then assembled and aligned together in a predetermined order. The unfired ceramic material is then fired and flattened, as necessary. The MLC thus produced is used for making chip-to-package interconnection to a semiconductor chip for which it was designed. Upon a positioning and attaching of the semiconductor chip onto the MLC substrate, the chip can then be electrically connected thereto, as appropriate. Alternatively, the MLC may include a cavity for receiving the semiconductor chip therein. Electrical interconnection between the MLC package and the semiconductor chip can be made using wirebonding, flip-chip, thermally activated bonding, and/or other chip-to-package interconnect techniques known in the art. Wirebonding, for instance, involves the use of wires for connecting a wirebond pad on the semiconductor chip with a corresponding wirebond pad on the MLC. The substrate also includes input/output pins, or other suitable form of input/output connections, for interfacing the chip to a next level of packaging, for example, to a printed circuit board, or the like.

In addition, for MLC substrates containing a cavity, it is typical for a solid ground or solid power plane to be screened onto a cavity layer, i.e., a layer having a cavity therein. Screening of a solid ground or power plane upon a cavity layer presents a number of manufacturing problems in the high volume manufacturing of substrates, as known by those skilled in the art. Still further, conventional MLC substrates typically contain a layer which includes wirebond pads, vias, and redistribution lines, all on the same layer, further requiring multiple patterning steps.

Referring now to FIG. 1, a semiconductor chip 10 is generally characterized by a series of bond pads 12 positioned about an outer perimeter thereof. The bond pads facilitate the making of chip-to-package interconnections, that is, for making electrical connections between the chip and a substrate package. The semiconductor chip 10 can further be characterized as having a particular wire-out requirement. The wire-out requirement of the semiconductor chip is that particular connection requirement for connecting each of the particular wirebond pads of the semiconductor chip to a wirebond pad of the packaging substrate. The wirebond pads, vias, and wiring networks of the packaging substrate are designed in conjunction with the wire-out requirement of the semiconductor chip and further in accordance with a particular I/O pin assignment of the substrate package. In addition, the particular I/O pin assignment of the substrate is driven by the requirements of the next level of packaging, e.g., the printed circuit board.

Wire-out requirements for a particular semiconductor chip are subject to change, for instance, as follows. During a manufacturing run of a particular semiconductor chip design, semiconductor chips may be produced which do not all possess the same level of functionality, even though they were manufactured according to the same processing steps. A sort of the produced chips by their functional capability may lead to a sorting of the chips into several groups, wherein each group possesses different wire-out requirements. For instance, let's assume that a semiconductor chip design is for a 200 MHZ microprocessor. A particular run of the manufacturing process for the 200 MHZ processor, however, may produce processor chips which fall into one of several groups. That is, out of a single manufacturing run, one-third of the chips might be sorted and categorized into a 200 MHZ group, one-third of the chips into a 160 MHZ group, and the remaining one-third of the chips into a 150 MHZ group. The groups of processor chips thus lead to different wire-out requirements for each group. As a result, while the chips may have the same number of wirebond pads, each group of chips has a distinct wire-out. In other instances, changes may be deliberately made to the manufacturing process, for the purpose of making small modifications to the semiconductor chips such that the chips can function in different applications, such as providing additional features, etc. In this later instance, the revisions of a particular chip generally result in the revised chip design having a unique wire-out, also.

Furthermore, it is known in the art for the packaging industry to utilize multiple bond pads on a semiconductor chip for wirebond attachment to the same wirebond pad on the substrate. In that case, the particular wirebond pad of the substrate was often widened to accommodate these multiple wirebonds. This has usually been done for the purpose of tying a signal pad on the chip to a voltage wirebond pad on the substrate. If the latter was attempted with a signal wirebond pad, the avoidance of crossing any of the wirebond leads would force the constraint that the die pads on the chip must be adjacent, or in extremely close proximity.

When a semiconductor chip is designed and/or modified as discussed herein above, it is quite common to find that there is no package available which is compatible with the chip for the purpose of interfacing the chip to the next level of packaging. Accordingly, a unique package compatible with the chip is required. Furthermore, as a result, there are literally thousands of single-purpose semiconductor chip packages available.

Fabricating specialized packages for each new chip design or modification becomes expensive, particularly for chip designs having 200–300 pads, each requiring connection to the package for signal, power, or ground. Unless a chip is properly designed for a pre-existing package, connections by way of wirebonds or thermally activated bonding connections cannot be made. If the chip has not been laid out so that direct connections from the edges of a chip can be made to corresponding signal, power, or ground pads on an available chip package, a special package must then be designed and fabricated. The later results in significant additional costs per chip package.

In addition, in a high volume manufacturing environment, a substrate manufacturer may employ a particular class of substrate packages for packaging chips from several customers. However, each of the customers typically has different requirements which drive unique substrate designs for each chip. Furthermore, a single customer may have multiple allied chip designs or versions (i.e., 486DX2, 486DX4, etc.) which also results in multiple substrate designs for that particular customer.

In the highly volatile commodities market of the present day semiconductor device industry, customer requirements and volumes frequently change in very short periods of time. As a result, the substrate manufacturer must adapt and shift production rapidly from one part number to another while minimizing unusable part numbers in inventory. Manufactured substrates which have been designed for a particular chip are rendered obsolete once the chip requirements change. Additionally, the packaging market is highly cost competitive. A small price increase greater than the competition can result in a loss of orders for a manufacturer.

It would thus be desirable to provide a single universal substrate design for use in packaging at least two semiconductor chips having different wire-out requirements.

SUMMARY OF THE INVENTION

It is an object of the present invention to provide a substrate for accommodating allied semiconductor chip designs for meeting the requirements of one or more customers with a single design, thereby minimizing part numbers, hardware, and excess work-in-progress (WIP) in inventory. The following detailed description discusses a method and substrate for accomplishing the same.

In addition, the present invention also addresses and solves a multitude of manufacturing problems, as well as provide a substrate having a minimum of layers which meets the needs of customers in a timely and efficient manner. There has thus been provided an effective low cost universal substrate for use to meet the requirements of multiple customers and multiple chip design requirements.

According to the present invention, a universal substrate includes an input/output (I/O) layer having a fixed I/O assignment of I/O locations for connection with a printed circuit board or the like. A chip receiving layer is provided for receiving one of at least two different but allied semiconductor chips, wherein each of the at least two different but allied chips include a set of bond pads and have a unique wire-out requirement. A first layer includes a plurality of bond pads and vias, the plurality of bond pads including at least two sets of bond pads, wherein each set is adapted for bond connection with a respective one of the at least two different semiconductor chips when received by said receiving means and further in accordance with a respective wire-out requirement. A second layer, different from the first layer, includes redistribution lines for coupling the plurality of bond pads and vias of the first layer to the I/O locations of the I/O layer in accordance with the wire-out requirements of the at least two different semiconductor chips and the fixed I/O assignment.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF a PREFERRED EMBODIMENT OF THE INVENTION

Figure 2:
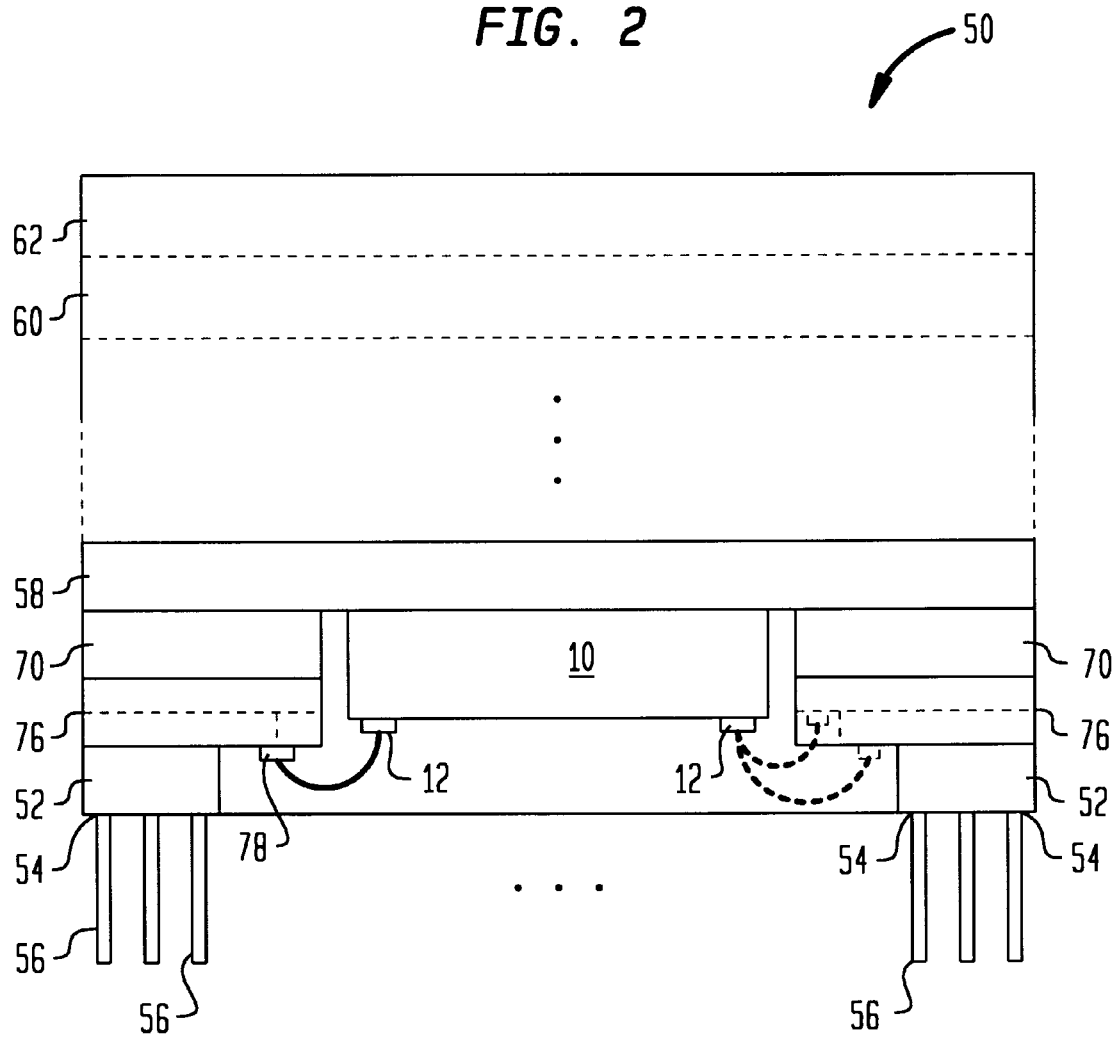
FIG. 2 shows cross-sectional view of a preferred embodiment of the substrate in accordance with the present invention.

Turning now to FIG. 2, in a preferred embodiment of the universal substrate according to the present invention, a multilayer ceramic (MLC) substrate 50 includes a plurality of layers as shown in a cross-sectional view of a cavity-down package orientation. Substrate 50 includes an input/output (I/O) layer 52 having a fixed I/O assignment of I/O locations 54 for connection with a printed circuit board or the like (not shown). I/O pins 56 are shown positioned and attached, such as, by brazing, at respective I/O locations 54, i.e., pin-out locations. A semiconductor chip attachment layer 58 (i.e., die attach layer) provides a means for receiving one of at least two different but allied semiconductor chips, wherein the semiconductor chips are characterized by a prescribed degree of similarity but different wire-out requirements. An example of different but allied semiconductor chips may include related 200 MHZ, 160 MHZ, and 150 MHZ microprocessor chips of a particular semiconductor chip family. Similarly, different but allied semiconductor chips may include different versions of a chip, such as, 486DX2, 486DX4, etc. Other examples of different but allied semiconductor chips are possible.

Figure 3:
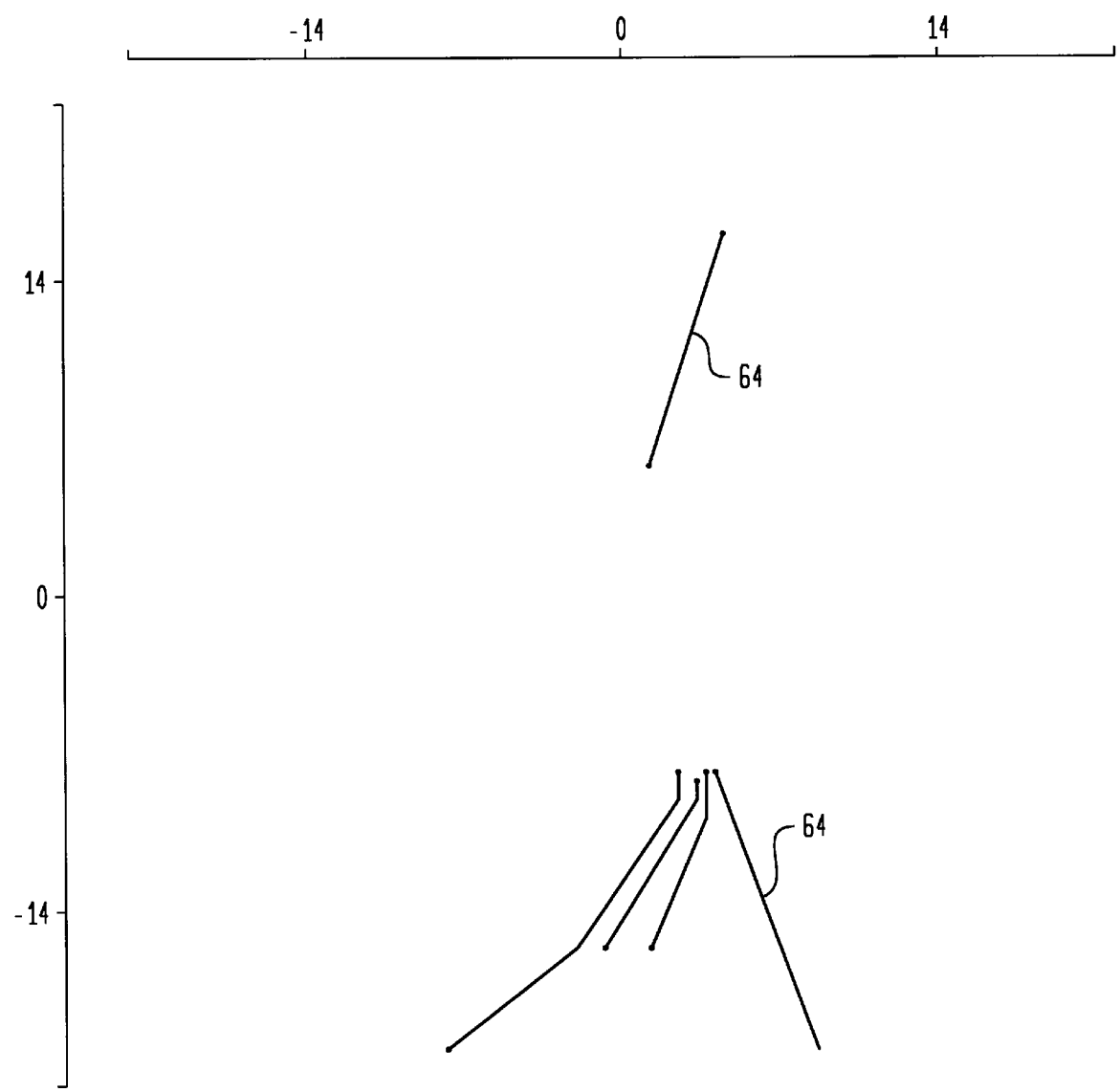
FIGS. 3–7 illustrate various layers of the substrate of FIG. 2 in further detail.
Figure 4:
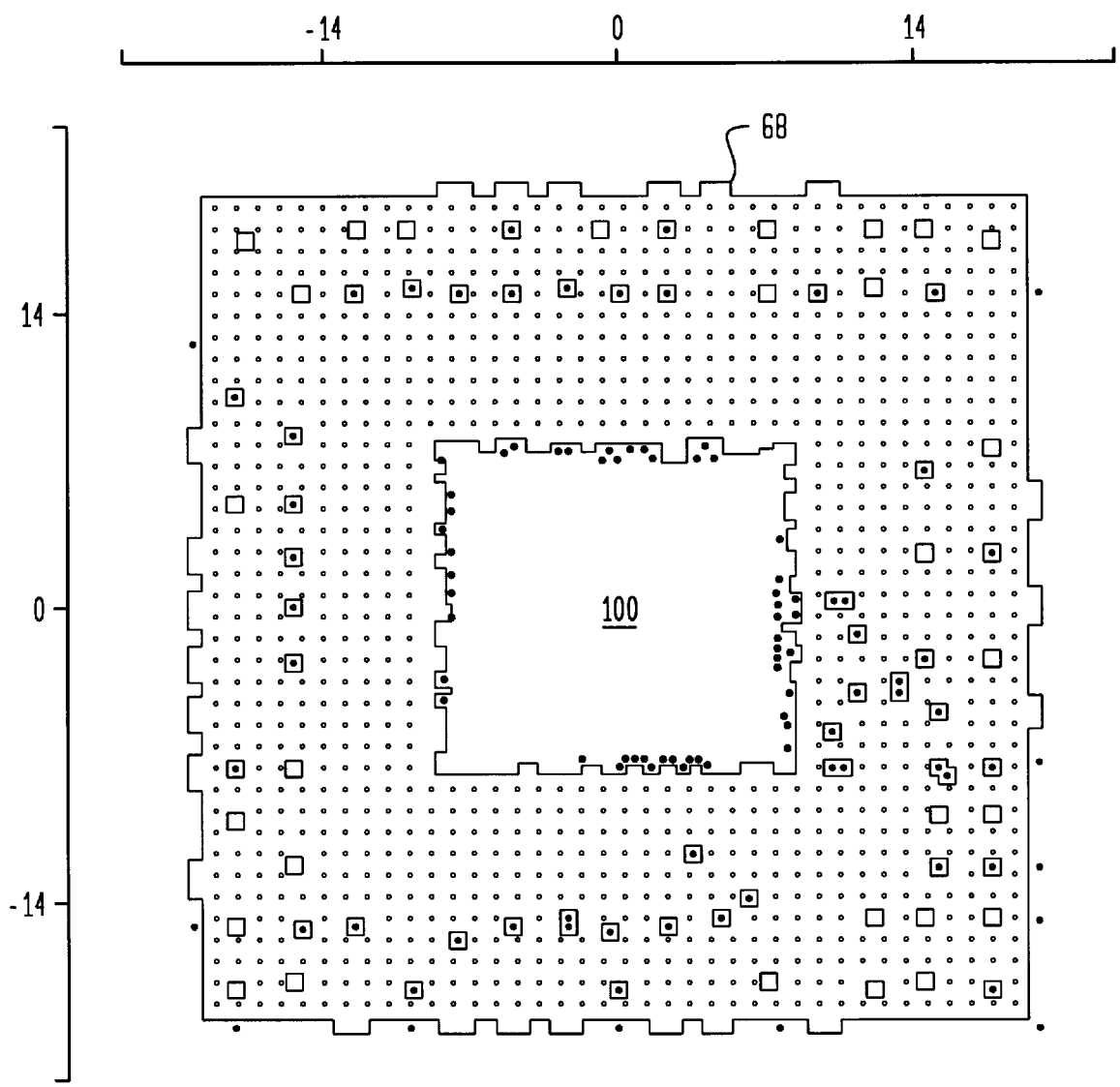

Layers 60 and 62 may include one or more wiring and or voltage layers. For example, layer 62 can comprise a redistribution layer having a pattern of redistribution lines 64 thereon (FIG. 3). Lines 64 are patterned upon a respective layer according to a particular redistribution requirement. In addition, layers 60 and 58 may represent a ground plane layer and a power plane layer, respectively. Layers 60 and 58 can each include a solid voltage plane pattern 68, corresponding to a solid ground plane and a solid power plane, respectively, as shown for example in FIG. 4. Alternatively, layers 60 and 58 can include a semi-solid patterned ground/power plane, respectively. In the embodiment shown in FIG. 2, die attach layer 58 serves a dual purpose (i.e., as a semiconductor die attachment layer and as a power plane layer). A die attachment area is included on layer 58, corresponding to area 100, as shown, for example, at the center of pattern 86 in FIG. 4.

According to one aspect of the present invention, the need to screen a solid ground plane or power plane on a cavity layer has been advantageously eliminated. That is, in a preferred embodiment according to the present invention, the ground/power planes are screened upon non-cavity containing layers, 60 and 58, such as shown in FIG. 2. In addition, the present invention advantageously enables a more even distribution of metal within the substrate, allowing for more uniform shrinkage within the substrate (minimizing camber). With improved metal loading, much less substrate flattening is required during the manufacturing of the substrate.

Figure 5:
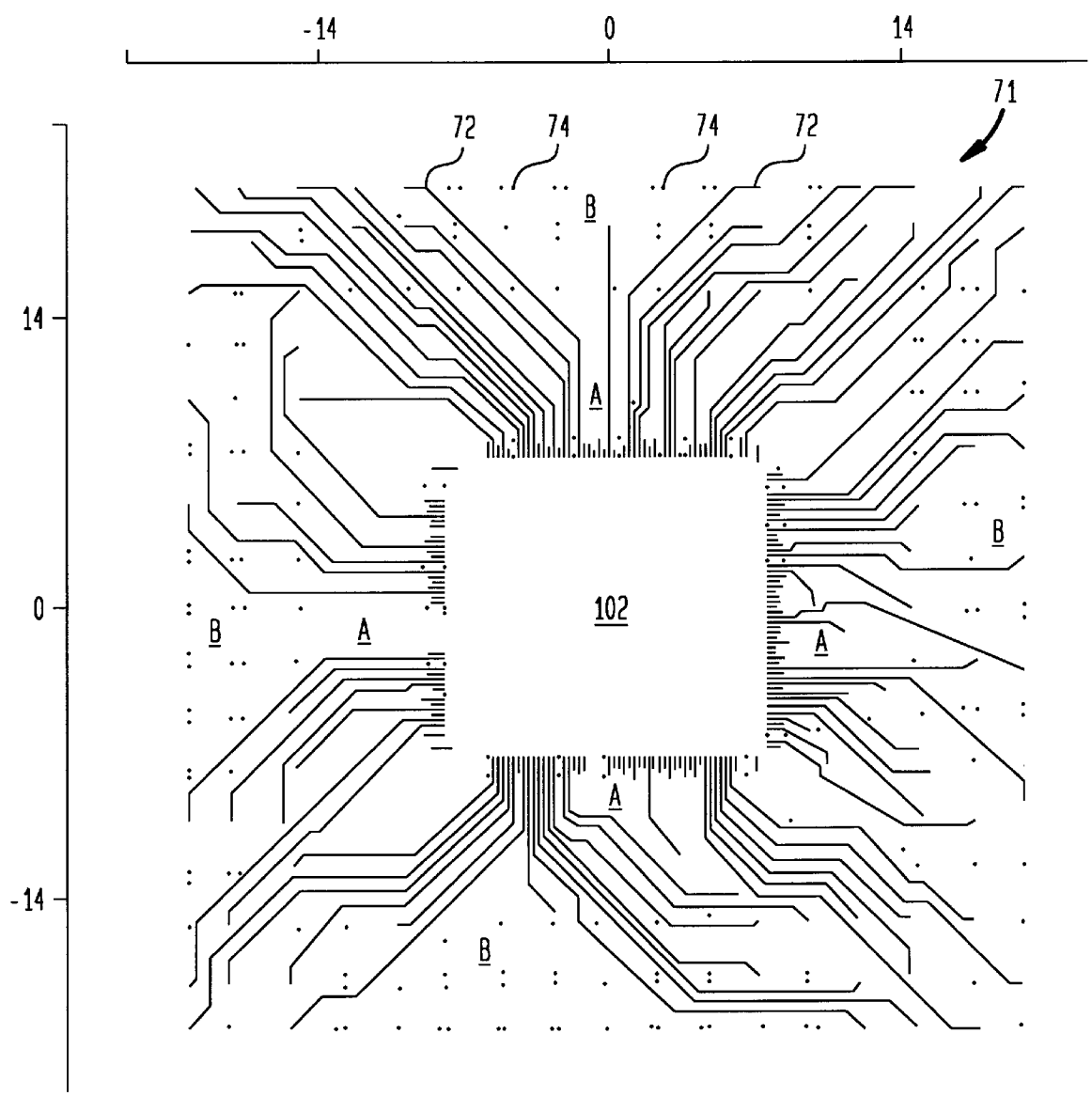

Turning now to FIGS. 2 and 5, layer 70 includes a redistribution layer. Redistribution layer 70 is patterned with an appropriate pattern 71 of redistribution lines 72 and vias 74, for example, as shown in FIG. 5. Pattern 71 also includes a cavity area 102 which corresponds to a cavity in layer 70. As shown, cavity area 102 is of a generally square shape, however, other shapes can be used as appropriate for a particular semiconductor chip requirement.

In a preferred embodiment, only redistribution lines 72 and vias 74 are patterned on layer 70. Redistribution lines 72 and vias 74 are patterned using a suitable screening paste or ink, such as is known in the art, wherein the paste or ink is optimized for exhibiting good electrical properties. Further as shown in FIG. 5, the redistribution lines 72 are each characterized by a first and a second width thickness. In a first region "A" proximate to an edge of cavity area 102, the redistribution lines have a first width thickness. The first width thickness is less than the second width thickness (i.e., thinner). The thinner width advantageously allows for a tighter spacing requirement to be obtained between adjacent redistribution lines in the region "A" proximate the edge of the cavity area 102, further enabling a greater density of redistribution lines to be achieved on the layer. The redistribution line pattern is further characterized by the second width dimension in a second region "B", the second region "B" being outside of the first region and distal from the edge of the cavity area 102. The second width dimension advantageously allows for the redistribution lines to be broadened out.

Figure 6:
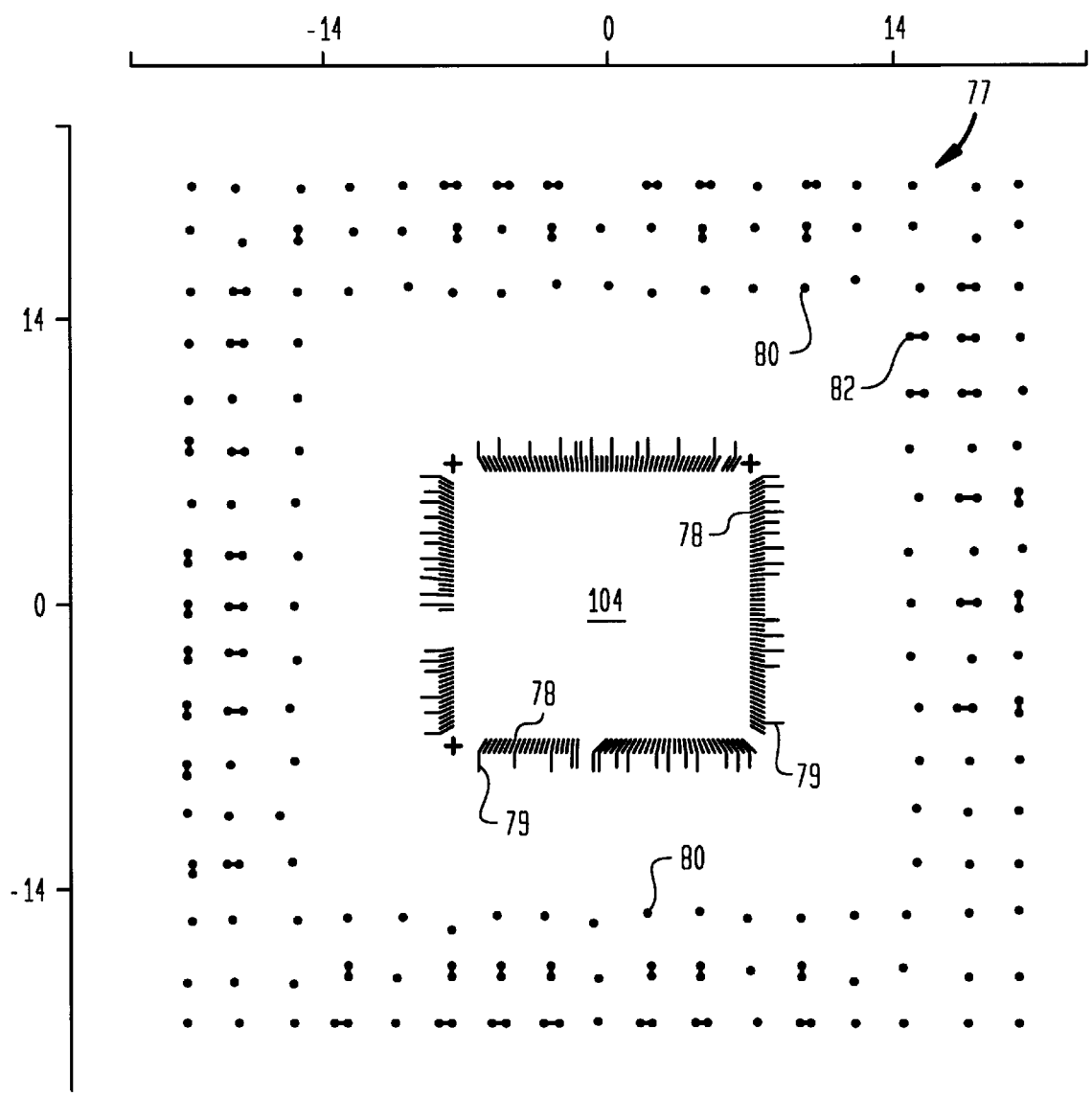

Turning now to FIGS. 2 and 6, layer 76 includes a bond pad layer. In a preferred embodiment, layer 76 includes a wirebond pad layer. It should be understood by those skilled in the art that bond pads 76 may alternatively include bond pads suitable for electrical interconnection, as appropriate, using flip-chip, thermally activated bonding, and/or other chip-to-package interconnection techniques known in the art. Bond pad layer 76 is patterned with an appropriate pattern 77 of bond pads 78 and vias 80, for example, as shown in FIG. 6. Pattern 77 also includes a cavity area 104 which corresponds to a cavity in layer 76. As shown, cavity area 104 is of a generally square shape, however, other shapes can be used as appropriate for a particular semiconductor chip requirement.

In a preferred embodiment, only bond pads 78 and vias 80 are patterned on layer 76. Bond pads 78 and vias 80 are patterned using a suitable screening paste or ink known in the art, wherein the paste or ink is characterized as a high definition paste which is optimized for producing high quality feature definition of a desired pattern. In other words, the paste or ink used for patterning bond pads 78 and vias 80 produces good physical feature definition of the necessary patterns. Slight jogs 82 are patterned and used for connecting adjacent vias as may be required. Certain of the patterned bond pads include tails 79 extending in a direction away from the cavity area 104, the tails 79 being used as necessary for connection with corresponding vias of an adjacent layer when assembled, in accordance with a particular application.

Limiting the features of layer 76 to include substantially only bond pads 78 and vias 80 advantageously allows for the screening of pattern 77 upon layer 76 to be accomplished with only a single deposition or screening pass. Other advantages will be apparent to those skilled in the art. The screening is further carried out using an optimal high definition paste, as mentioned above. Bond pads 78 preferably comprise wirebond pads.

Figure 12:
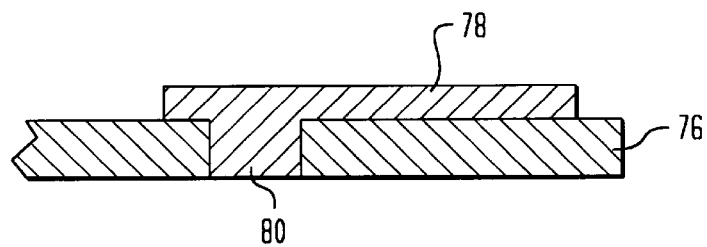
FIGS. 12–14 show various views of bond pad and via formation in connection with the method of making a substrate in accordance with the present invention.
Figure 13:
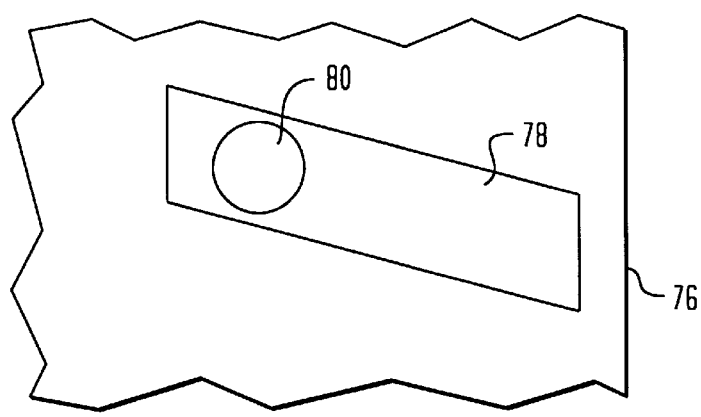

As discussed herein, substrate 50 according to the present invention includes bond pad layer 76, layer 76 containing substantially only bond pads and vias. This is to be distinguished from other conventional substrates which contain a layer including wirebond pads, vias, and redistribution lines all on the same layer. Bond pad layer 76 of the present invention allows for the use of high yielding high definition patterning paste or ink which is specifically designed and highly suitable for use in the fabrication of a bond pad, i.e, in the preferred embodiment, a wirebond pad. In addition, the present invention allows for a greater control and the optimization of screening parameters to the wirebond pad geometry(ies), i.e., for making cosmetically good pads. Still further, the method of producing layer 76 (bond pads and vias) is accomplished with a single screening pass of the wirebond layer 76. See for instance, FIGS. 12 and 13, corresponding to a side view and top view, respectively, of a bond pad and via formed in a same screening step. An appropriately apertured mask (not shown), having an aperture corresponding to the shape of a particular bond pad, can be used.

Figure 14:
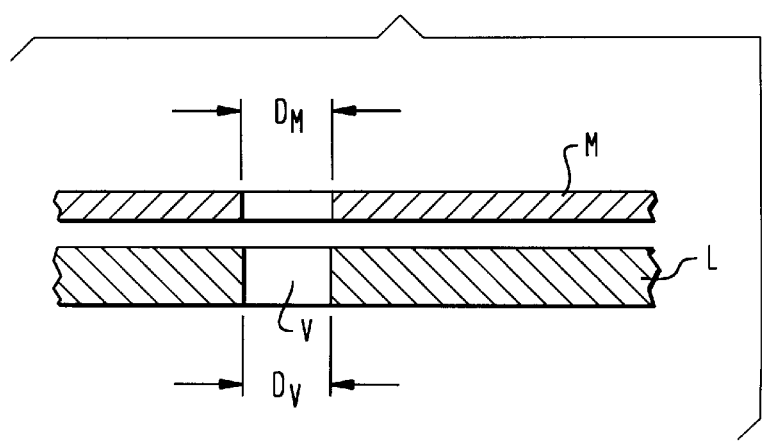

In the preferred embodiment, the plurality of the wirebond pads thus comprise a first material, the first material being selected for providing bond pads having optimal high definition geometric features. The redistribution lines comprise a second material different from the first material. The second material is selected for providing redistribution lines having optimal electrical characteristics. In addition, the vias include via caps, wherein the via caps have a same cross-sectional dimension as the vias. FIG. 14 illustrates a mask M having an aperture $D_M$ for dispensing the appropriate paste therethrough into a via V of layer L having an aperture $D_V$. Having the via caps and vias of the same cross-sectional dimension advantageously allows for a greater density of patterned features (i.e., bond pads and vias) to be obtained on the layer.

In addition, as shown in FIG. 6, the bond pads are radially oriented about the center of the cavity area 104. The spacing between adjacent bond pads 78 is typically less than or equal to the width of a single bond pad 78. Radially orienting of the bond pads 78 allows for an increased density of pads to be obtained, thereby maximizing the use of the available real estate of the layer in the region around cavity area 104. Similarly, bond pads 78 may be oriented orthogonally with respect to an edge of the cavity area 104, in instances where a lower density requirement or other design considerations permit the same. The choice of radial orientation or orthogonal orientation is a design consideration determined, in part, upon the available real-estate on the layer about the cavity and upon the number of necessary substrate to chip connections needed to be made. As previously mentioned, the bond pads may alternatively include bond pads suitable for electrical interconnection using flip-flop, thermally activated bonding, and/or other chip-to-package interconnect techniques known in the art.

Figure 7:
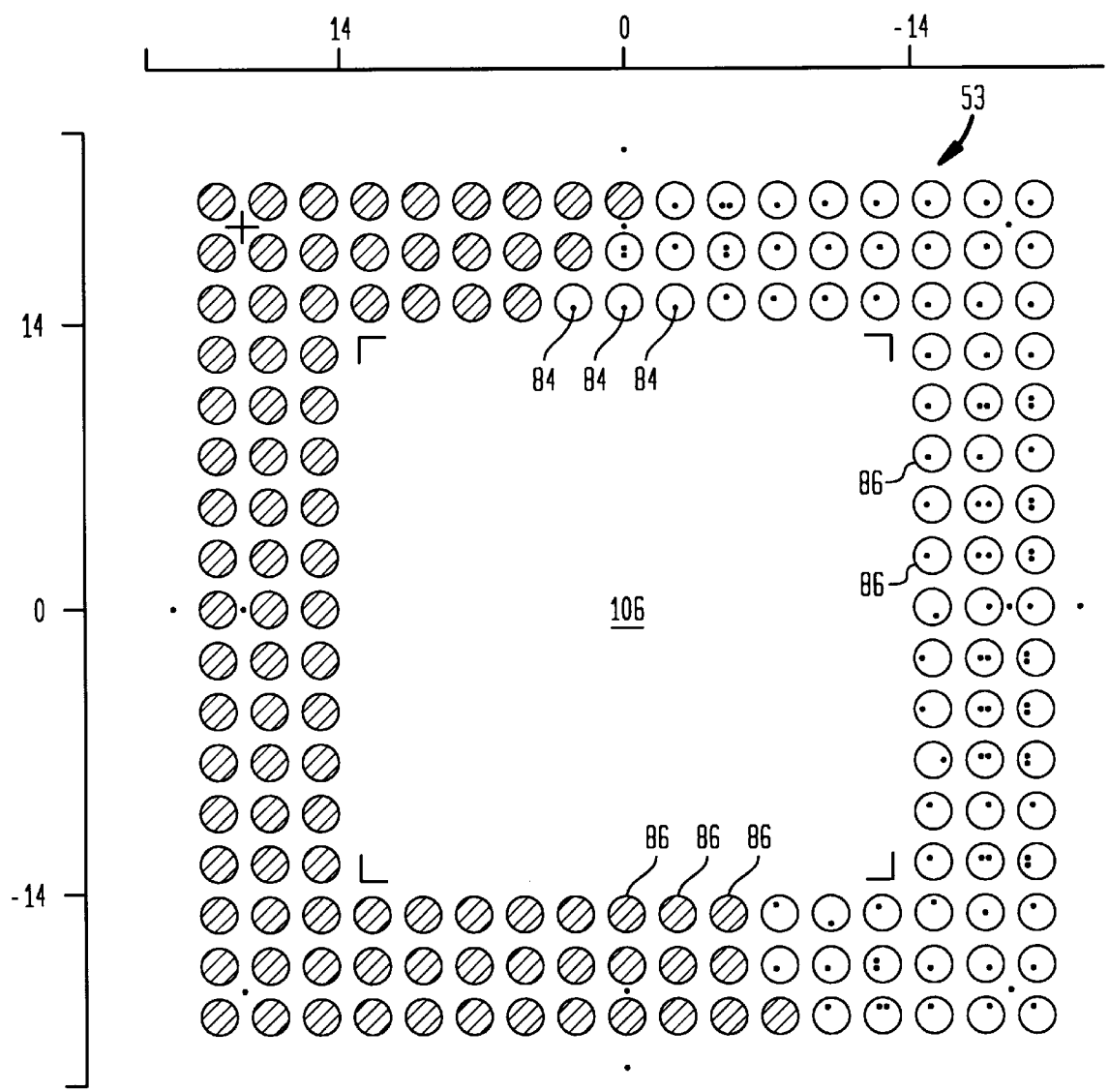

Turning now to FIGS. 2 and 7, layer 52 includes an I/O layer. I/O layer 52 is patterned with an appropriate pattern 53 of through vias 84 and I/O pads 86, for example, as shown in FIG. 7. For clarity purposes, a number of pads 86 are shown only as circle outlines in FIG. 7. The I/O pads 86 (corresponding to I/O locations 54 of FIG. 2) may include metallic pads. The I/O locations 86 are selected in accordance with the I/O layout required for a particular application such as a 168 pin grid array. Pattern 53 also includes a cavity area 106 which corresponds to a cavity in layer 52. As shown, cavity area 106 is of a generally square shape, however, other shapes can be used as appropriate for a particular semiconductor chip requirement. Cavity area 106 is typically larger than cavity area 104, corresponding to the cavity in layer 52 being larger that the cavity in layer 76, respectively. The size of the cavity in layer 52 must be larger than the cavity in layer 76 by at least an amount sufficient to leave bond pads 78 exposed for bonding purposes. In addition, the area about the cavity in layer 76 upon which the bond pads 78 are located is referred to as a shelf or the shelf area.

Figure 8:
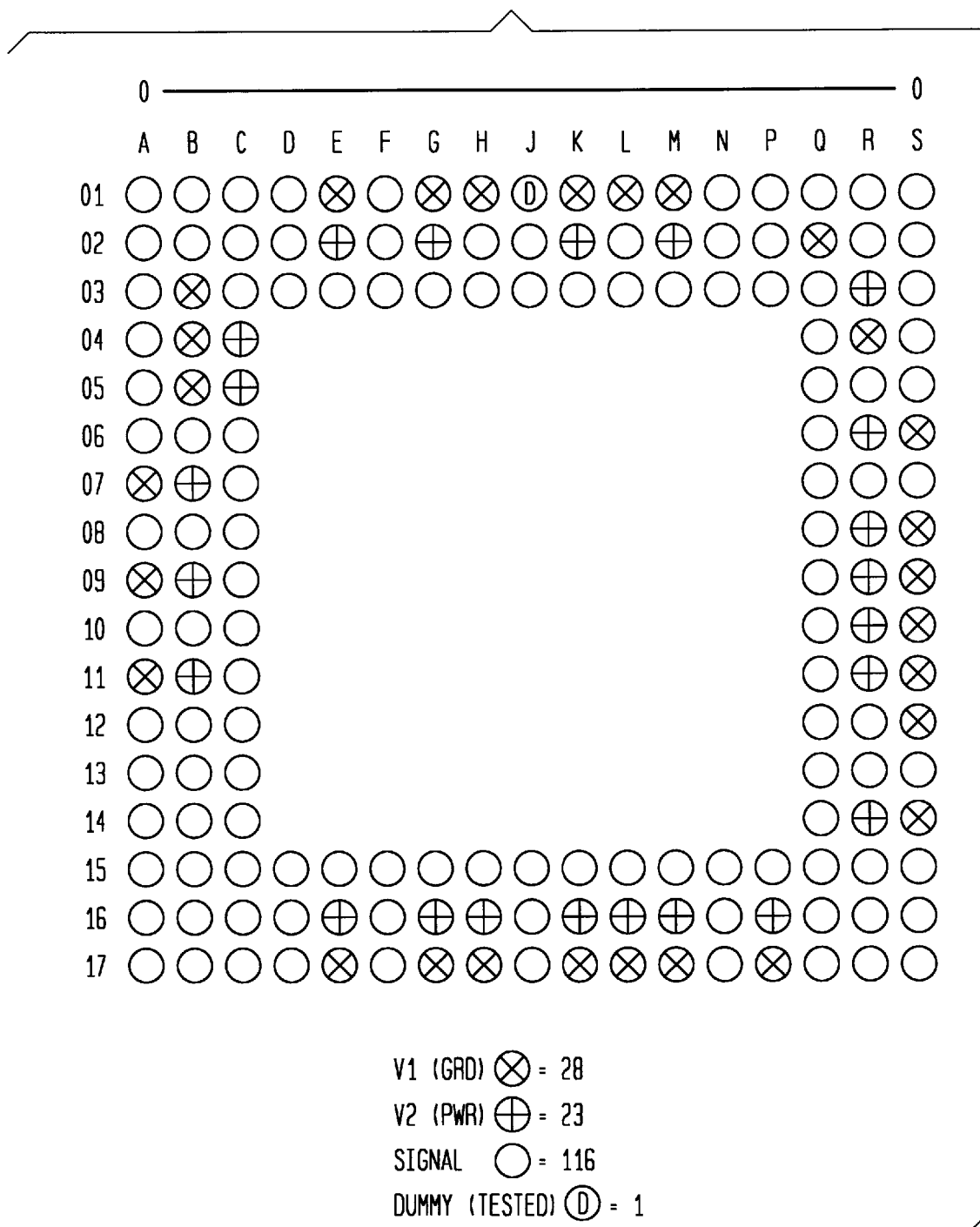
FIG. 8 shows an exemplary input/output pin function configuration according to a fixed I/O assignment.

FIG. 8 is an example of a fixed I/O signal assignment for a 168 pin grid array package. The I/O assignment includes I/O pin assignments for ground, power, signal, and dummy inputs or outputs, as necessary for a particular family of semiconductor chip packaging applications. In the example of a personal computer, the computer may contain a printed circuit board capable of accepting various speed processor chips. The socket for the processor chip on the circuit board generally has a fixed pin-out. The universal substrate according to the present invention advantageously can be used to package either of at least two different but allied semiconductor chips while maintaining a fixed I/O assignment, corresponding to the fixed pin-out.

Figure 1:
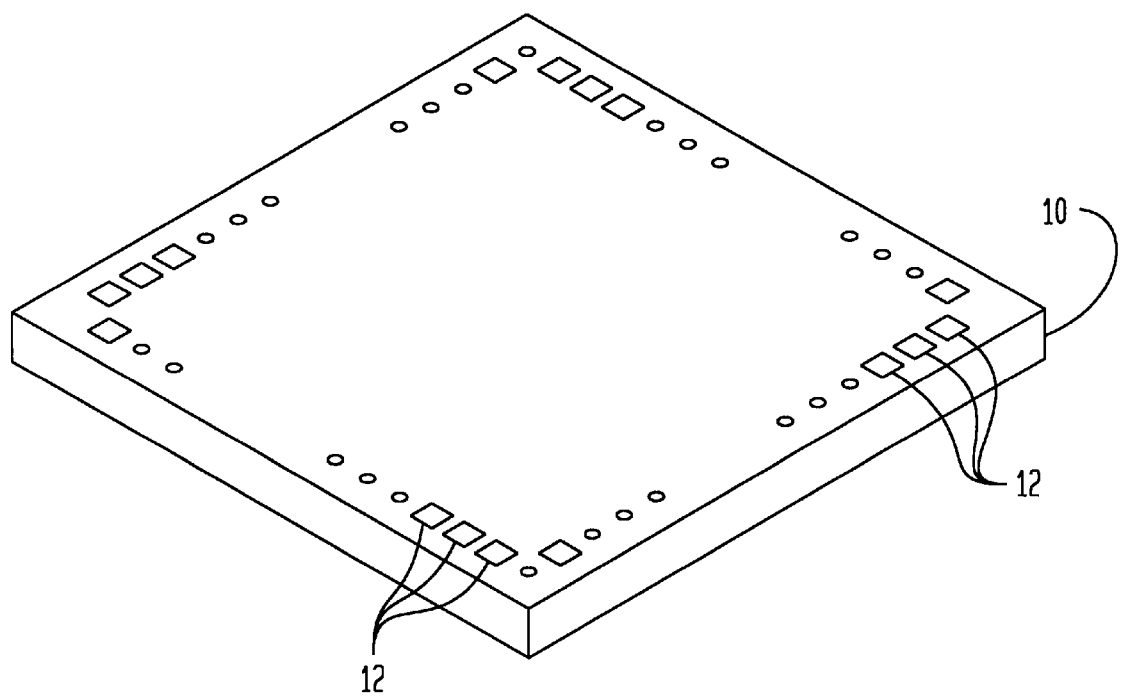
FIG. 1 illustrates a semiconductor chip.
Figure 9:
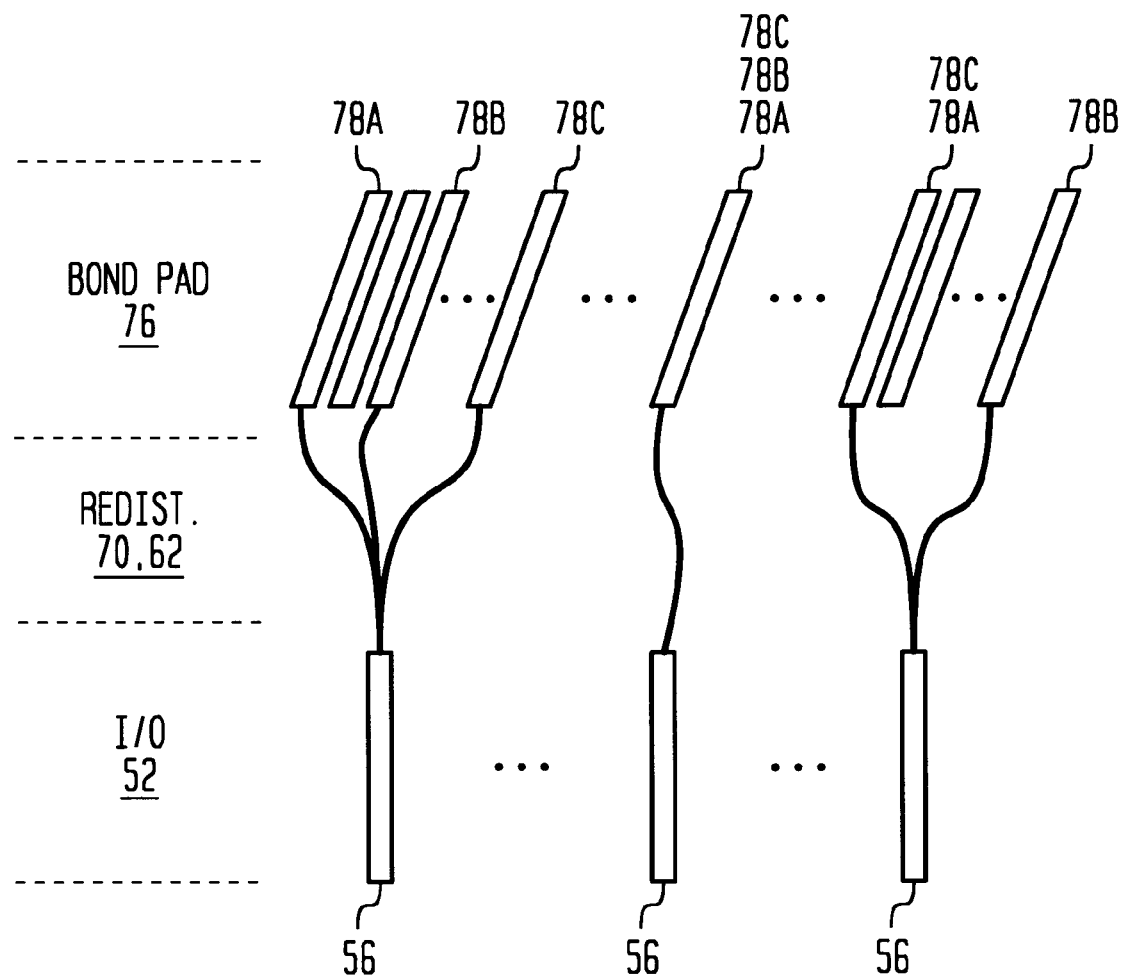
FIG. 9 illustrates an example of the relationship of first, second, and third sets of the plurality of bond pads of the bond pad layer, the redistribution lines, and the I/O pin locations in accordance with the present invention.
Figure 11:
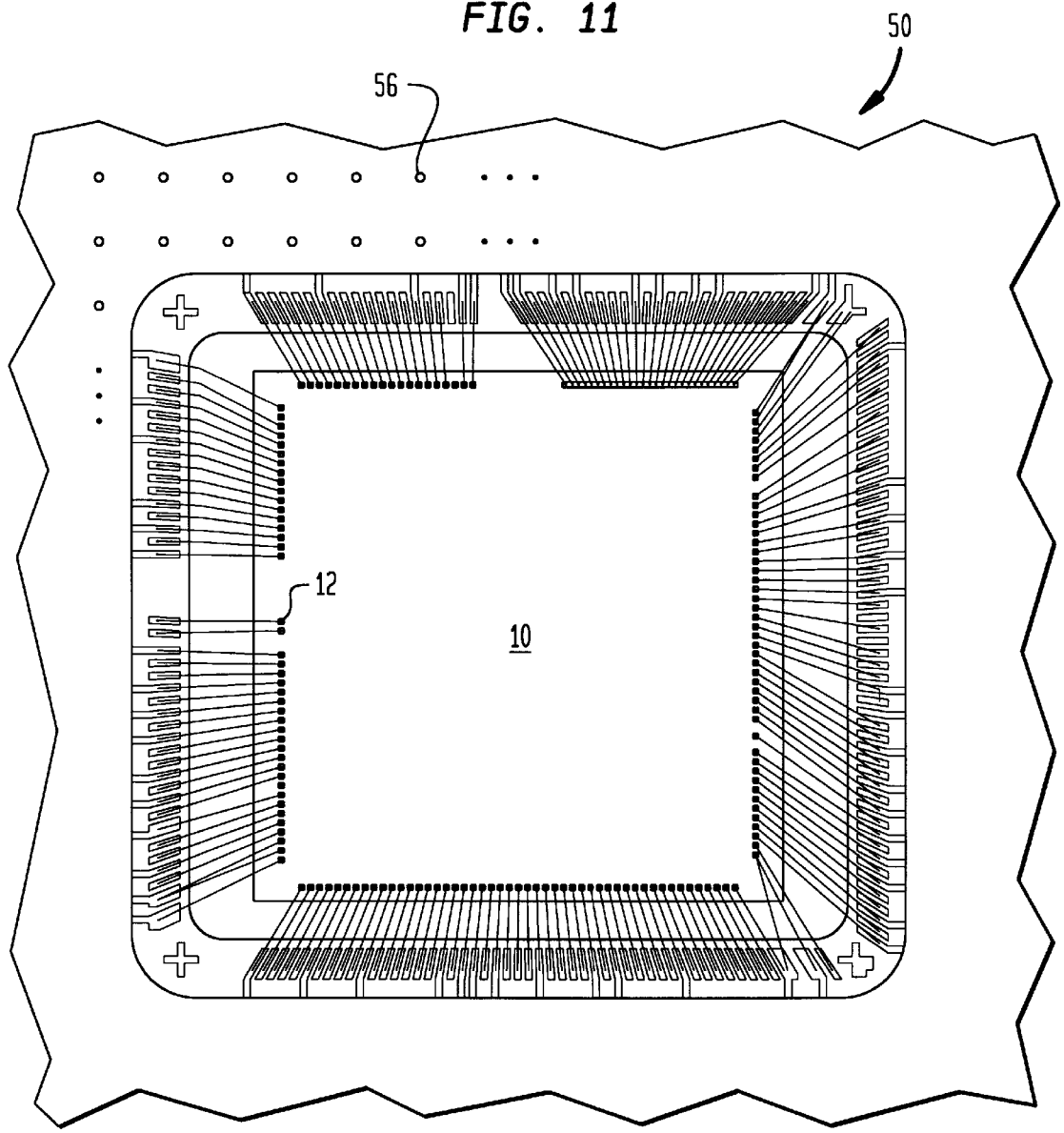

As previously discussed, each semiconductor chip 10 includes a set of bond pads 12, the chip being characterized by a unique wire-out requirement (FIGS. 1 and 11). The bond pads 12 of the semiconductor chip 10 facilitate the making of chip-to-package interconnections, i.e., for making electrical connections between the chip 10 and the substrate package 50 (FIG. 2). Wirebond layer 76 of the substrate 50 includes a plurality of bond pads 78 and vias 80, wherein bond pads 78 include wirebond pads. Turning now to FIGS. 6 and 9, the plurality of bond pads 78 include at least two sets of bond pads, as indicated for example by 78A, 78B, and 78C. Each set of bond pads (78A, 78B, or 78C, for example) is adapted for wirebond connection with a respective one of the at least two different allied semiconductor chips when the respective chip is received upon the die layer and further in accordance with the respective wire-out requirement. As shown in FIG. 9, a first set (78A) of wirebond pads of the plurality of wirebond pads 78 of layer 76 contains at least one wirebond pad which is different from the wirebond pads of a second set (78B). The first set (78A) of wirebond pads is positioned on layer 76 for wirebond connection with a first one of the different but allied semiconductor chips. Similarly, a second set of wirebond pads (78B) is positioned on layer 76 for wirebond connection with a second one of the different but allied semiconductor chips. Thus it is, in accordance with the present invention, that multiple bond pads in a same signal net are allowed to be in different regions of layer 76. In other words, as FIG. 9 further illustrates, more than one bond pad 78 can be connected to any one output pin 56 (corresponding to a same signal net). In this latter instance, the one or more bond pads of a same signal net are not required to be adjacent to one another, but may actually be separated by any number of bond pads or be in a different region of the substrate. A further discussion is given below in conjunction with the wirebonding of the chip bond pads to the substrate bond pads. The redistribution lines of the MLC substrate 50 are used for making appropriate internal substrate connections.

Referring once again to FIG. 2, wirebond layer 76 has been provided with a cavity. The die attachment layer 58 is coupled proximate to the wirebond layer 76, wherein redistribution layer 70 is disposed in between layers 58 and 76. Redistribution layer 70 is provided with a cavity of substantially similar size as the cavity of layer 76. Semiconductor chip 10, for mounting on the substrate 50, is received and positioned within the cavity of layers 76 and 70, and further, suitably attached to die attachment layer 58. As previously mentioned, the plurality of wirebond pads 78 on the wirebond layer 76 are preferably disposed radially about and positioned proximate an edge of the cavity. The chip-to-package connection will thereafter be complete upon a subsequent wirebonding of corresponding bond pads of the chip with appropriate bond pads of layer 76, to be discussed further below.

The redistribution layer of the substrate 50 (individually or collectively referring to one or more redistribution layers 70, 62, and/or others, as appropriate) is different from the wirebond layer 76, as discussed herein above. The redistribution layer includes redistribution lines for coupling the plurality of bond pads and vias of the wirebond layer 76 to the I/O locations 54 of the I/O layer 52. More particularly, the redistribution lines couple the pads, vias, and I/O locations together in accordance with the wire-out requirements of the at least two different allied semiconductor chips and the fixed I/O assignment. Still further, the redistribution lines connect at least two different ones of the plurality of wirebond pads of the wirebond layer 76 to a same I/O location 54 for accommodating the wire-out requirements of the at least two different but allied semiconductor chips while maintaining the fixed I/O assignment.

As indicated above, the chip-to-package connection is completed by a subsequent wirebonding of corresponding bond pads of the chip with appropriate bond pads of layer 76. In the wirebonding process, the wires used for wirebonding are not insulated. Thus it is highly desirable to design the wiring connections of the universal substrate 50, and thus placement of the wirebond pads and respective interconnection with the I/O locations according to a fixed I/O assignment of the universal substrate design, so as to prevent any undesirable cross over or interference between wirebond wires for each particular semiconductor chip. In other words, the particular requirements of each of the chips, for which the universal substrate is intended for, are taken into consideration when designing the placement of the plurality of wirebond pads on layer 76.

As noted above, prior to the present invention, the packaging industry has utilized multiple bond pads on a semiconductor chip for wirebond attachment to the same wirebond pad on the substrate. By contrast, the present invention has multiple wirebond pads in the same signal net or network of the substrate connected with a single I/O location. This allows the wirebond pads 78 of a same signal net to be in different regions of the substrate; they can even be on different sides of a cavity, or on different cavity shelves. Thus, the flexibility of which I/O can be wire-bonded to a die pad is dramatically increased.

A wirebonder apparatus, which is generally known in the art, is used for wirebonding the semiconductor chip to the substrate. The wirebonder is suitably programmed, in a manner known in the art, according to the particular wire-out requirement of the semiconductor chip being mounted in conjunction with the corresponding wirebond pad locations of the MLC substrate. That is, the wirebonder is programmed in accordance with the necessary wire-out requirement of the chip being mounted and the layout of the wirebond pads 78 of layer 76, and more particularly, for attaching the chip bond pads to the appropriate set of the plurality of wirebond pads.

In accordance with the present invention, a customization for the universal substrate advantageously occurs at the bonding or wirebond level. The substrate according to the present invention is thus advantageously adapted for packaging one of multiple allied semiconductor chips, each semiconductor chip having a different wire-out requirement and the substrate maintaining a fixed input/output assignment for connection to a next level of packaging. Furthermore, the present invention advantageously results in facilitating significant savings to the manufacturer without sacrificing substrate performance. Still further, no laser aberration or other modification (i.e., customization) of substrate layers is required subsequent to the fabrication of the substrate 50 in accordance with the present invention.

Figure 10:
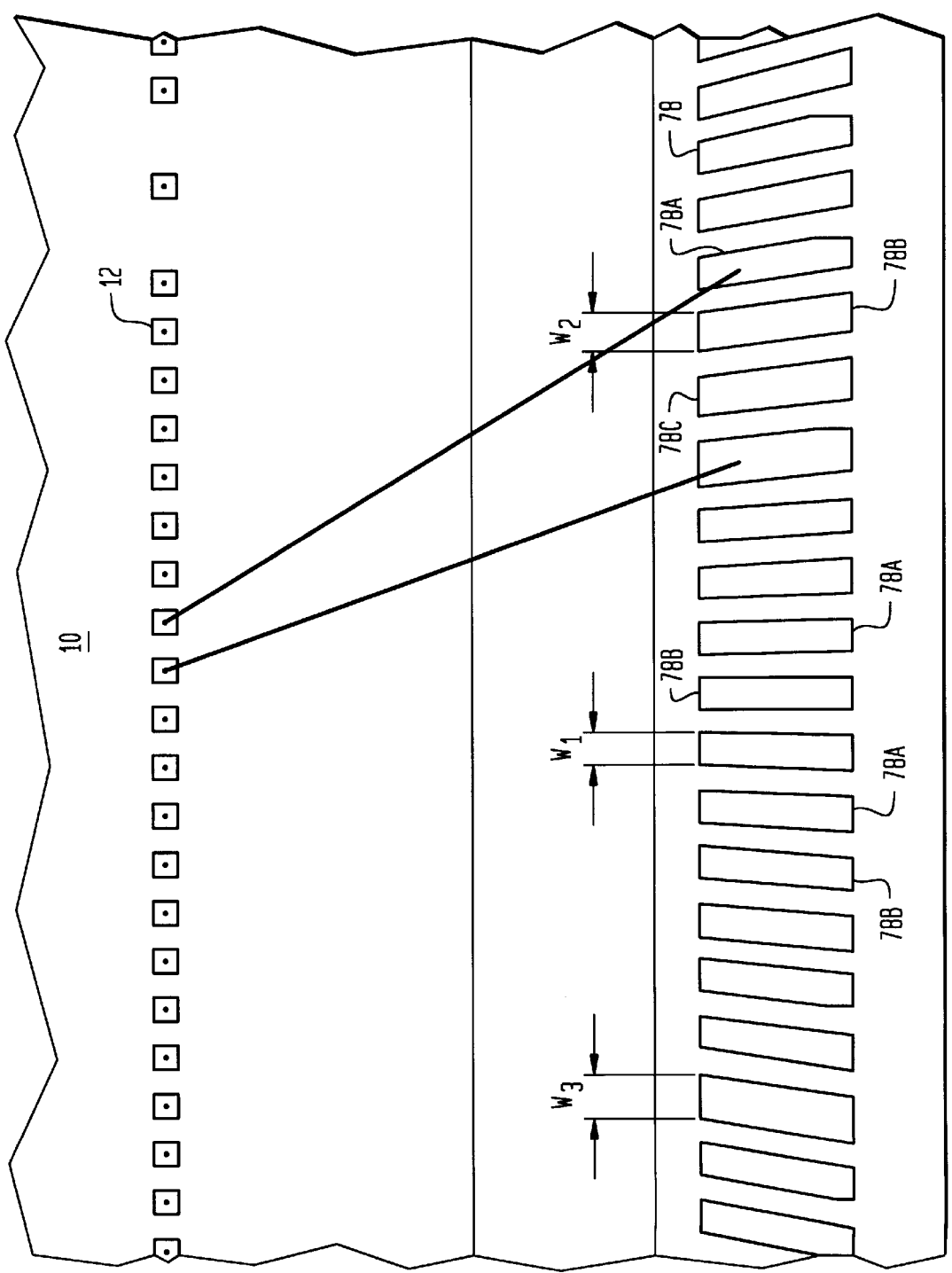
FIGS. 10 and 11 are illustrative of wirebond connections between bond pads of a chip and the substrate in accordance with the present invention.

Turning now to FIGS. 10 and 11, examples of wirebond connections between bond pads 12, 78 of a chip 10 and substrate 50 respectively are shown. Note that bond pads 78 can include single width $W_1$, double width $W_2$ and triple width $W_3$ pads, for example. The shape of individual wirebond pads 78 can be advantageously tailored to a particular pattern shape as necessary.

After die attachment and wirebonding are completed, the substrate may be suitably capped, as desired. For instance, the cavity can be filled with a gas (for example, nitrogen), capped and then hermetically sealed with a suitable eutectic braze material. A hermetically sealed package generally provides a finished device having a higher reliability. Similarly, the package may be capped with a simple epoxy material, thus forming a non-hermetically sealed package. The reliability of the non-hermetically finished device is a little less than the hermetically sealed device, however, the non-hermetically sealed device is less expensive to manufacture.

The present invention thus provides an economical and cost-effective alternative to having a multitude of package designs for packaging a number of different but related semiconductor chips. The present invention further provides for a greater selection of packaged semiconductor chips having a same I/O interfacing assignment, using a universal semiconductor chip package design.

While the orientation of the universal substrate according to the invention has been shown and described as a cavity-down package, the universal substrate may equally be implemented as a cavity-up package. In addition, while the invention has been shown and described as using I/O pins for interfacing with a next level of packaging, it is to be understood that such interfacing can equally be carried out using other suitable known techniques, such as solder ball connect, ball grid array (BGA) and/or column grid array (CGA).

Still further, there are a number of variations on the number of shelves used for placement of the wirebond pads. For example, there can be one, two, three, or more shelves, as necessary or required for a particular universal design. In most instances, there are no more than three shelves used, since in the case of more than three shelves, the wires tend to get overly long. It is desirable, however, to keep the wirebond wire lengths to a minimum so as to prevent any undesirable impact on operational performance of the semiconductor chip after it has been packaged.

For instance, in FIG. 2, layer 76 is shown as alternately being comprised of two sublayers, as indicated by the dashed lines. Each sublayer contains a cavity, the first sublayer having a cavity larger than the cavity of the second sublayer, further wherein the cavities are disposed concentric with each other. In this later instance, wirebond pads are patterned upon shelves of the sublayers, proximate an edge of a respective cavity. That is, the combination of the two cavities define first and second shelves, respectively, upon which bond pads are disposed. An example of two wirebond connections to wirebond pads on the two shelves is shown in FIG. 2 with dashed lines also. Furthermore, in this example, the die attachment layer is coupled proximate the first and second sublayers, wherein a semiconductor chip to be packaged is positioned within the respective cavities of the sublayers. Appropriate chip-to-package interconnections can then be made between the bond pads of the semiconductor chip and the bond pads of the first and second sublayers, in accordance with the particulars of the wire-out requirement of the semiconductor chip and the corresponding set of wirebond pads of the wirebond layer. Note that, a bond pad on a first shelf and a bond pad on a second shelf can be connected to a same I/O pin, according to the present invention. Furthermore, bond pads of a particular set of the plurality of bond pads can also be disposed on both first and second shelves as may be required.

In addition to that as shown and discussed, yet another alternate embodiment of the present invention can include a package having no wirebond pad shelves. In this later instance, the semiconductor chip would be positioned and secured directly upon the surface, adjacent and/or proximate to the wirebond pads of the substrate. Wires can then be wirebonded between appropriate wirebond pads of the semiconductor chip and the substrate. In general, this later instance is less desirable, since the material which is used for securing the chip to the surface of the substrate has a tendency to flow out from under the semiconductor chip and interfere with the wirebond pads, thus rendering the achievement of a high quality wirebond less likely.

As previously discussed, separate substrate packages have heretofore been required each time the wire-out requirement for a chip design changes. The present invention advantageously overcomes the requirement for separate substrate packages, each time a chip design changes.

In accordance with the present invention, a universal substrate has been provided that can be used for any number of different allied semiconductor chips having a degree of commonality. In brief, this has been accomplished by an addition of wirebond pads and appropriate modifications to the internal networks of vias and distribution lines of the substrate for ensuring a fixed input/output assignment of the substrate. Furthermore, the present invention advantageously reduces manufacturing costs by eliminating any unnecessary metallization layers previously required for obtaining a greater metallization balance within the substrate. Additional features and advantages of the present invention include use of existing manufacturing cavity formation tooling, including inserts and punch dies. One manner in which this has been accomplished is by the use of green sheets of a greater thickness than previously used and the screening of the via caps the same size as the vias. Thus, an adequate spacing between features is allowed to be maintained to ensure test yields.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, while the semiconductor chip package disclosed herein is a 168 pin grid array package, it should be understood that the concept of the present invention is applicable to other lead count packages as well and to packages of designs other than pin grid arrays. In addition, other materials used for the layers of the package may be other than ceramic, such as, plastic or organic. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of making a substrate, the substrate for receiving one of at least two different semiconductor chips, each chip including a set of bond pads and having a unique wire-out requirement, said method comprising the steps of:
   providing an input/output (I/O) layer having a fixed I/O assignment of I/O locations for connection with a printed circuit board or the like;
   providing a first layer having a plurality of bond pads and vias, the plurality of bond pads including at least two sets of bond pads, wherein each set is adapted for bond connection with a respective one of the at least two different semiconductor chips when received by the substrate and further in accordance with a respective wire-out requirement; and
   providing a second layer, different from said first layer, having redistribution lines for coupling the plurality of bond pads and vias of said first layer to the I/O locations of said I/O layer in accordance with the wire-out requirements of the at least two different semiconductor chips and the fixed I/O assignment.

2. The method of claim 1, wherein
the step of providing said first layer includes providing a cavity in said first layer, wherein a semiconductor chip is received and positioned within the cavity.

3. The method of claim 2, further wherein
the step of providing said first layer includes disposing the plurality of bond pads on said first layer radially about the center of the cavity and proximate an edge of the cavity.

4. The method of claim 2, further wherein
the step of providing said first layer includes disposing the plurality of bond pads orthogonally about the cavity and positioned proximate an edge of the cavity.

5. The method of claim 1, wherein
the step of providing said first layer further includes providing two sublayers, each sublayer including a cavity, and further disposing the plurality of bond pads upon a shelf about an edge of each respective cavity, wherein a semiconductor chip is received and positioned within respective cavities of the sublayers.

6. The method of claim 1, wherein
the plurality of the bond pads comprise a first material, the first material for providing optimal geometric features, and
the redistribution lines comprise a second material different from the first material, the second material for providing optimal electrical characteristics.

7. The method of claim 6, wherein
the vias include via caps, the via caps having a same cross-sectional dimension as the vias.

8. The method of claim 1, wherein
a first set of bond pads of the plurality of bond pads of said first layer contains at least one bond pad which is different from the bond pads of a second set.

9. The method of claim 1, wherein
the redistribution lines further connect at least two different ones of the plurality of bond pads of said first layer to a same I/O location for accommodating the wire-out requirements of the at least two different semiconductor chips while maintaining the fixed I/O assignment.

10. The method of claim 9, wherein
the step of providing said first layer includes providing a cavity in said first layer, wherein a semiconductor chip is received and positioned within the cavity.

11. The method of claim 10, further wherein
the step of providing said first layer includes disposing the plurality of bond pads on said first layer radially about the center of the cavity and proximate an edge of the cavity.

12. The method of claim 10, further wherein
the step of providing said first layer includes disposing the plurality of bond pads orthogonally about the cavity and positioned proximate an edge of the cavity.

13. The method of claim 9, wherein
the step of providing said first layer further includes providing two sublayers, each sublayer including a cavity, and further disposing the plurality of bond pads upon a shelf about an edge of each respective cavity, wherein a semiconductor chip is received and positioned within respective cavities of the sublayers.

14. The method of claim 10, wherein
the plurality of the bond pads comprise a first material, the first material for providing optimal geometric features, and
the redistribution lines comprise a second material different from the first material, the second material for providing optimal electrical characteristics.

15. The method of claim 14, further wherein
providing said second layer includes providing a second cavity of similar size dimension and being concentric with the cavity of said first layer, and still further wherein the redistribution lines have a first width dimension in a first region proximate an edge of the second cavity and a second width dimension in a second region distal from the edge of the second cavity, the first width dimension being smaller than the second width dimension.

16. The method of claim 9, wherein
a first set of bond pads of the plurality of wirebond pads of said first layer contains at least one wirebond pad which is different from the wirebond pads of a second set.

17. A method of making a substrate, the substrate for receiving either one of two different semiconductor chips, each chip including a set of wirebond pads and having a unique wire-out requirement, said method comprising the steps of:
   providing an input/output (I/O) layer having a fixed I/O assignment of I/O pin locations for connection with a printed circuit board or the like;
   providing a first layer having a plurality of wirebond pads and vias, the plurality of wirebond pads including two sets of wirebond pads, wherein each set is adapted for wirebond connection with a respective one of the two different semiconductor chips when received by the substrate and further in accordance with a respective wire-out requirement, wherein the plurality of the wirebond pads comprise a first material, the first material for providing optimal geometric features, and providing a second layer, different from said first layer, having redistribution lines for coupling the plurality of wirebond pads and vias of said first layer to the I/O locations of said I/O layer in accordance with the wire-out requirements of the two different semiconductor chips and the fixed I/O assignment, wherein the redistribution lines comprise a second material different from the first material, the second material for providing optimal electrical characteristics, further wherein the redistribution lines connect at least two different ones of the plurality of wirebond pads of said first layer to a same I/O location for accommodating the wire-out requirements of the two different semiconductor chips.

18. The method of claim 17, wherein said step of providing a first layer includes providing a cavity in said first layer, wherein a semiconductor chip is received and positioned within the cavity, further wherein the plurality of wirebond pads on said first layer are disposed radially about the center of the cavity and positioned proximate an edge of the cavity, further wherein said step of providing a second layer includes providing a second cavity of similar size dimension and being concentric with the cavity of said first layer, and still further wherein the redistribution lines have a first width dimension in a first region proximate an edge of the second cavity and a second width dimension in a second region distal from the edge of the second cavity, the first width dimension being smaller than the second width dimension.

19. A substrate comprising:

an input/output (I/O) layer having a fixed I/O assignment of I/O locations for connection with a printed circuit board or the like;

means for receiving one of at least two different semiconductor chips, each chip including a set of bond pads and having a unique wire-out requirement;

a first layer having a plurality of bond pads and vias, the plurality of bond pads including at least two sets of bond pads, wherein each set is adapted for bond connection with a respective one of the at least two different semiconductor chips when received by said receiving means and further in accordance with a respective wire-out requirement; and a second layer, different from said first layer, having redistribution lines for coupling the plurality of bond pads and vias of said first layer to the I/O locations of said I/O layer in accordance with the wire-out requirements of the at least two different semiconductor chips and the fixed I/O assignment.

20. The substrate of claim 19, wherein the redistribution lines further connect at least two different ones of the plurality of bond pads of said first layer to a same I/O location for accommodating the wire-out requirements of the at least two different semiconductor chips while maintaining the fixed I/O assignment.

* * * * *